(12) United States Patent
Maleki et al.

(10) Patent No.: US 6,871,025 B2
(45) Date of Patent: Mar. 22, 2005

(54) DIRECT ELECTRICAL-TO-OPTICAL CONVERSION AND LIGHT MODULATION IN MICRO WHISPERING-GALLERY-MODE RESONATORS

(75) Inventors: Lute Maleki, Pasadena, CA (US); Anthony F. J. Levi, South Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 548 days.

(21) Appl. No.: 09/883,085

(22) Filed: Jun. 15, 2001

(65) Prior Publication Data

US 2002/0021765 A1 Feb. 21, 2002

Related U.S. Application Data

(60) Provisional application No. 60/212,091, filed on Jun. 15, 2000.

(51) Int. Cl.[7] .................................................. G02B 6/26
(52) U.S. Cl. ....................................................... 398/183
(58) Field of Search ............................ 385/30, 142, 15, 385/24, 3, 123; 359/245; 398/87, 186; 372/92, 6, 20, 46, 67, 94; 257/E33.006, E33.069; 324/636, 653; 375/300

(56) References Cited

U.S. PATENT DOCUMENTS

| | | | | |
|---|---|---|---|---|
| 3,714,438 A | * | 1/1973 | Hahn et al. | 398/182 |
| 4,968,945 A | | 11/1990 | Woskov et al. | 324/633 |
| 5,718,979 A | * | 2/1998 | Marker et al. | 428/426 |
| 5,742,633 A | | 4/1998 | Stone et al. | 372/92 |
| 5,926,496 A | | 7/1999 | Ho et al. | 372/92 |
| 6,009,115 A | * | 12/1999 | Ho | 372/92 |
| 6,272,277 B1 | * | 8/2001 | Heo et al. | 385/142 |
| 6,441,934 B1 | * | 8/2002 | Boord et al. | 398/87 |
| 6,580,532 B1 | * | 6/2003 | Yao et al. | 398/39 |
| 6,580,851 B1 | * | 6/2003 | Vahala et al. | 385/30 |

* cited by examiner

Primary Examiner—Jason Chan
Assistant Examiner—David C. Payne
(74) Attorney, Agent, or Firm—Fish & Richardson P.C.

(57) ABSTRACT

Techniques for directly converting an electrical signal into an optical signal by using a whispering gallery mode optical resonator formed of a dielectric material that allows for direct modulation of optical absorption by the electrical signal.

54 Claims, 5 Drawing Sheets

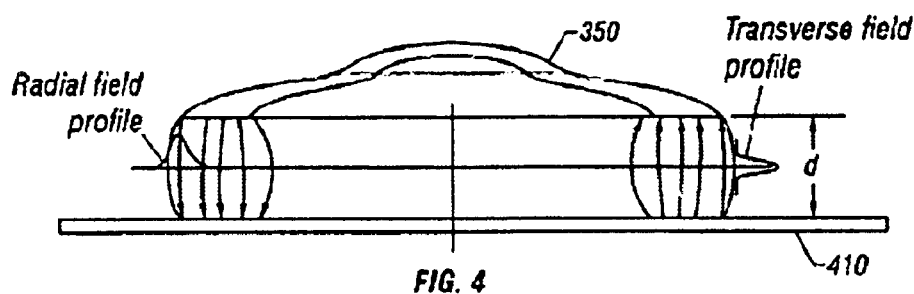
FIG. 4
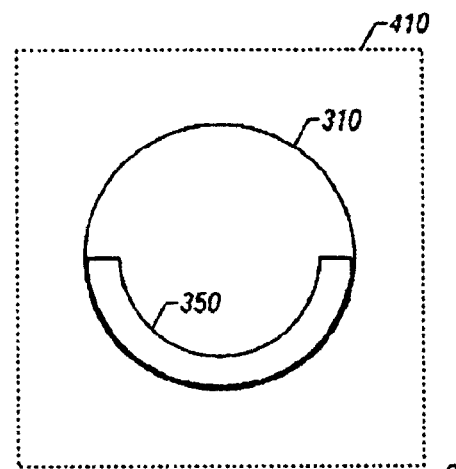
FIG. 5
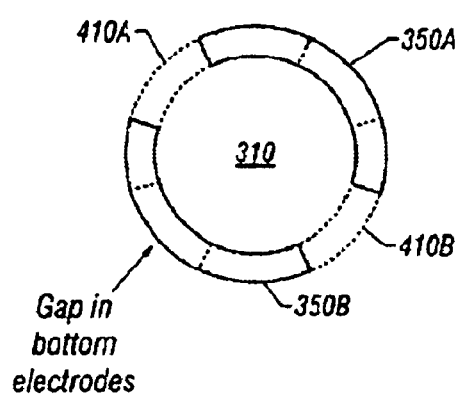
FIG. 6
FIG. 7
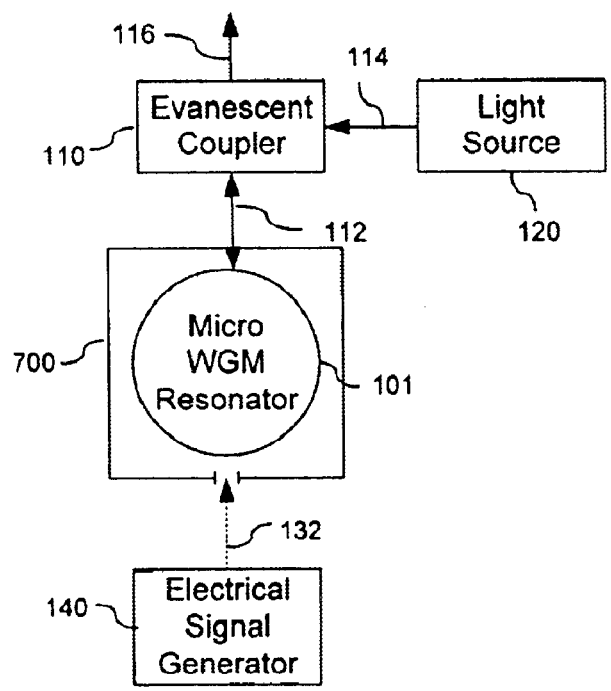

DIRECT ELECTRICAL-TO-OPTICAL CONVERSION AND LIGHT MODULATION IN MICRO WHISPERING-GALLERY-MODE RESONATORS

This application claims the benefit of U.S. Provisional Application No. 60/212,091 filed on Jun. 15, 2000.

ORIGIN OF THE INVENTION

The systems and techniques described herein were made in the performance of work under a NASA contract, and are subject to the provisions of Public Law 96–517 (35 USC 202) in which the Contractor has elected to retain title.

BACKGROUND

This application relates to conversion from an electrical signal to an optical signal and light modulation in response to an electrical signal.

An electrical signal may carry certain information in either digital or analog form. The information can be imbedded in a property of the electrical signal such as the phase or the amplitude. The information in the electrical signal may be created in various ways, e.g., by artificially modulating the electrical carrier, or by exposing the electrical carrier to a medium which interacts with the carrier. In some applications, such information may be transmitted, processed, stored, received, or detected in the electrical domain. For example, electrical cables can be used to transmit information in electrical form; many electronic circuits or processors (e.g., microprocessors) can process information in electrical form; satellites, radars, and wireless telephones or other electronic devices can transmit or receive information in electromagnetic waves traveling in free space without relying on conductive transmission media.

An optical wave may also be used as a carrier to carry information in either digital or analog form. Similar to an electrical signal, an optical carrier wave may be artificially modulated to carry desired information, or may be brought into interaction with an optical medium to acquire certain information indicating a characteristic of that medium. Examples for the artificial optical modulation include optical modulation by using an optical modulator such as an electro-optic material whose refractive index changes with an applied electric field, or modulation of a driving current in a semiconductor gain material (e.g., a multiple-quantum-well gain medium) which amplifies or generates an optical wave. Examples for interaction between an optical wave and an optical medium include measurements of the optical scattering, reflection, or transmission of optical media. Also similar to electrical signals, optical signals may be transmitted in free space or in optical transmission media such as optical waveguides (e.g., optical fibers or planar waveguides formed on semiconductor, glass or other substrates). In addition, optical signals may be processed or manipulated optically by using optical devices and stored in optical storage media.

Signal transmission, processing, or storage in optical domain may have advantages over the electrical counterpart in certain aspects. For example, optical signals are generally immune to electromagnetic interference which often limits the performance of electronic devices. Also, an optical carrier, having a carrier frequency much higher than that of an electrical signal, can carry more information than an electrical carrier due to the wider bandwidth associated with the higher optical carrier frequency. As another example, optical signals can be used allow for easy parallel transmission and processing to further increase the information carrying capacity as well demonstrated by the optical wavelength-division multiplexing (WDM) techniques.

Many applications may be designed to have electrical-optical "hybrid" configurations where both optical and electrical signals are used to explore their respective performance advantages, conveniences, or practical features. Some existing communication systems, for example, transmit signals in the optical form through fiber networks but process the information at a destination in electronic form (e.g., by one or more digital electronic processors). In such and other applications, the electrical-to-optical conversion is needed.

SUMMARY

This disclosure includes techniques for directly converting an electrical signal to an optical signal by using a micro whispering-gallery-mode resonator. The resonator may be formed of a dielectric material that has at least three different energy levels to allow for (1) at least one optical transition between the first and second energy levels at the signal wavelength of the optical signal and (2) an electronic transition between the second and third energy levels in resonance with the frequency of the electrical signal. In absence of the electronic transition between the second and the third energy levels caused by the electrical signal, the electronic population for optical transition between the first and second energy levels is optically transferred to the third energy level and hence no optical absorption occurs due to the population depletion. As a result, the dielectric material is optically transparent to the optical signal at the signal wavelength. When the resonator is exposed to the electrical signal oscillating at the resonance frequency between the second and third energy levels, the electrons trapped in the third energy level are transferred to the second energy level and hence become available for optical absorption so that the dielectric material is optically absorptive at the signal wavelength.

This direct interaction between the electrons and the applied electrical signal is used to modulate the optical absorption of the dielectric material. Since the quality factor of the resonator varies with the optical absorption of the dielectric material, a change in the electrical signal, such as the frequency or the amplitude, can modulate the quality factor by changing the optical absorption of the dielectric material to cause an optical modulation on the optical signal in the resonator. This operation directly converts the modulation in the electrical signal into a modulation in the optical signal.

The whispering-gallery-mode design of the resonator is used to provide an efficient coupling environment between the electrical modulation and the optical modulation. In absence of the electrical signal, the whispering-gallery-mode resonator, when properly designed, can achieve a high quality factor, which in turn produces narrow spectral linewidth of a supported whispering gallery mode. The electronic modulation by the electrical signal in resonance with the second and third energy levels causes the resonator to operate between the high quality factor and a low quality factor. Since the optical energy confined in a whispering gallery mode of the resonator is highly sensitive to the quality factor, a small amount of absorption of the electrical signal to cause an electronic population transfer from the third "trapped" energy level to the second energy level can be effectively amplified in an optical modulation on the amount energy stored in the resonator.

This system hence can provide not only an efficient electrical-to-optical conversion but also a highly sensitive detection method for measuring the electrical signal. In principal, a single event of absorption of a photon in the electrical signal by the dielectric material can be optically measured in this system. Various devices and systems may be built based on this whispering gallery mode resonator for electrical-to-optical conversion, optical modulation, and optical sensing of electrical signals.

BRIEF DESCRIPTION OF THE DRAWINGS

FIGS. 3, 4, 5, 6, and 7 show exemplary implementations of the electrical coupler in FIG. 1 for applying the input electrical signal to a portion or the entirety of the resonator.

DETAILED DESCRIPTION

Figure 1:
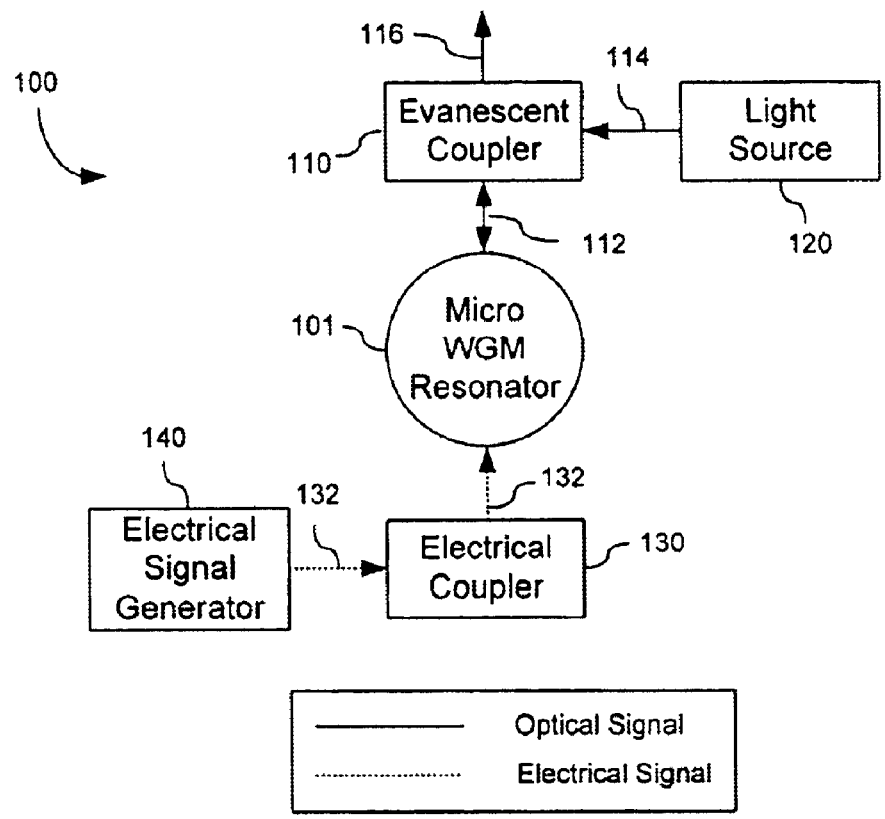
FIG. 1 shows one embodiment of a direct electrical-to-optical conversion system based on a micro whispering-gallery-mode resonator formed of a dielectric material with appropriate energy levels for interaction with an input electrical signal and an input optical signal.

FIG. 1. shows one embodiment 100 of a direct electrical-to-optical conversion system based on a micro whispering-gallery-mode resonator 101 formed of a dielectric material with appropriate energy levels. In one implementation, the micro resonator 101 generally may be formed from at least a portion of a whole dielectric sphere that includes the equator of the sphere. Such a resonator can support a special set of resonator modes known as "whispering gallery modes" which are essentially electromagnetic field modes confined in an interior region close to the surface of the sphere around its equator and circulating by total internal reflection inside the axially symmetric dielectric body. Microspheres with diameters on the order of $10–10^2$ microns have been used form compact optical resonators. Such resonators have a resonator dimension much larger than the wavelength of light so that the optical loss due to the finite curvature of the resonators can be small. The primary sources for optical loss include optical absorption in the dielectric material and optical scattering due to the inhomogeneity of the sphere (e.g., irregularities on the sphere surface). As a result, a high quality factor, Q, may be achieved in such resonators. Some microspheres with sub-millimeter dimensions have been demonstrated to exhibit very high quality factors for light waves, exceeding $10^9$ for quartz microspheres. Hence, optical energy, once coupled into a whispering gallery mode, can circulate at or near the sphere equator with a long photon life time. The resonator 101 may be the whole sphere or a portion of the sphere near the equator that is sufficiently large to support the whispering gallery modes such as rings, disks and other geometries.

The micro resonator 101 may also have non-spherical resonator geometries that are axially symmetric. Such a non-spherical resonator may be designed to retain the two-dimensional curvature confinement, low scattering loss, and very high Q values of typical spherical resonators (spheres, disks, rings, etc.). In one embodiment, instead of minimizing the eccentricity, such a non-spherical resonator may be formed by distorting a sphere to a non-spherical geometry to purposely achieve a large eccentricity, e.g., greater than $10^{-1}$. U.S. Application entitled "NON-SPHERICAL WHISPERING-GALLERY-MODE MICROCAVITY" and filed Mar. 22, 2001 by Maleki et al., for example, describes an oblate spheroidal microcavity or microtorus formed by revolving an ellipse around a symmetric axis along the short elliptical axis.

In both spherical and non-spherical micro resonators, optical energy can be coupled into the resonator by evanescent coupling, e.g., using an optical coupler 110 near the resonator 101 by less than one wavelength of the optical radiation to be coupled. Although a whispering gallery mode confined within the resonator 101, its evanescent field 112 "leaks" outside the resonator 101 within a distance about one wavelength of the optical signal 114. The optical coupler 110 may have a receiving terminal to receive an input optical wave 114 at a selected wavelength and a coupling terminal to evanescently couple the optical wave 114 into the resonator 101. In addition, the optical coupler 110 may also be used to couple the optical energy in one or more whispering gallery modes out of the resonator 101 to produce an optical output 116. The output 116 may be coupled to an optical detector to convert the information into electronic form or an optical device or system for photonic processing, optical storage, or optical transmission such as a fiber link. The input optical beam 114 may be generated from a light source 120 such as a laser.

Figure 2A:
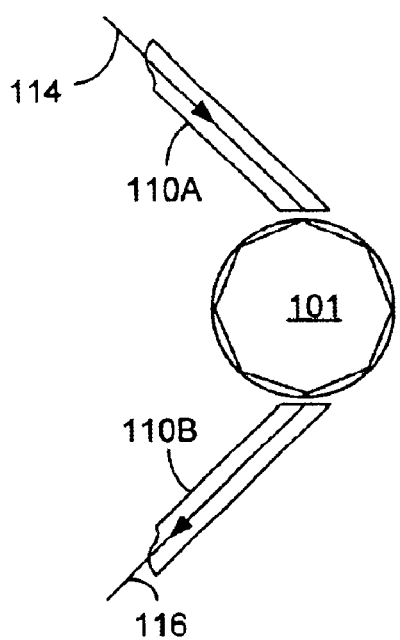
FIGS. 2A and 2B show exemplary implementations of the evanescent coupler in FIG. 1.
Figure 2B:
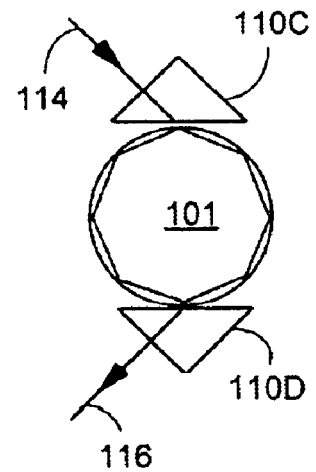

In one embodiment, the evanescent coupler 110 may be implemented by using one or two angle-polished fibers or waveguides 110A and 110B as shown in FIG. 2A. The angle-polished tip is placed near the resonator 101 to effectuate the evanescent coupling. The index of refraction of the fibers or waveguides 110A and 110B is greater than that of the resonator 101, and the optimal angle of the polish has to be chosen depending on the ratio of indices. See, e.g., V. S. Ilchenko, X. S. Yao, L. Maleki, Optics Letters, Vol. 24, 723 (1999). In another embodiment, evanescent coupler 110 may be implemented by using one or two micro prisms 110C and 110D as shown in FIG. 2B. A single angle-polished waveguide or fiber, or a single micro prism may be used to operate as the evanescent coupler 110 to couple both the input wave 114 and the output wave 116.

An electrical coupler 130 is provided in the system 100 to supply an electrical signal 132 at a selected electrical frequency in the RF, microwave, or millimeter spectral ranges for interaction with the selected energy levels of the dielectric material of the resonator 101. The electrical coupler 130 may be in various configurations to couple the electrical signal 132 to at least the region of the resonator 101 where the whispering gallery modes are present. The electrical signal 132 may be received from a unit 140 which may be an electrical signal generator, an antenna, a signal transmitter, or a material exposed to an electromagnetic radiation. When the signal 132 is generated by a signal generator 140, desired data or other information may be used to modulate the signal 132.

Figure 3:
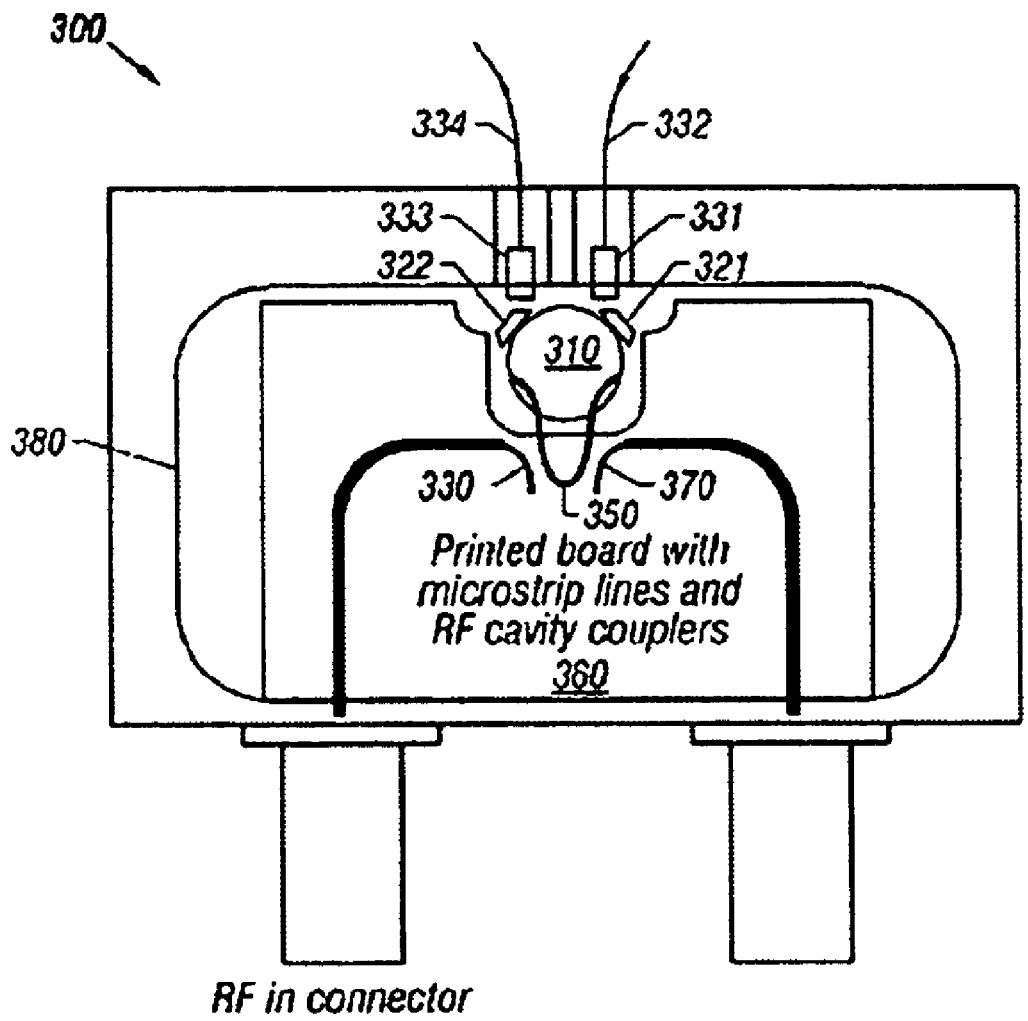

FIG. 3 shows one implementation 300 enclosed in a device housing 380 based on the system 100 in FIG. 1. Optical fibers 332 and 334 are used to guide input and output optical beams. Microlenses 331 and 333, such as gradient index lenses, are used to couple optical beams in and out of the fibers 334 and 332. Two prisms 321 and 322 are used as the evanescent couplers to provide evanescent coupling with a whispering gallery mode resonator 310. A RF microstrip line electrode 350 is used as the electrical coupler and is engaged to the resonator 310 to form a RF resonator to supply the electrical signal in electrical modes that are localized in the region where the optical whispering gallery modes are present. An input RF coupler 330 formed from a microstrip line is implemented to input the electrical energy into the RF resonator. A circuit board 360 is used to support the microstrip lines and other RF circuit elements. A second RF coupler 370, which may be formed from a microstrip line on the board 360, may also be used to produce a RF output. This signal can be used as a monitor for the operation of the device 300 or as an electrical output for further processing or driving other components.

FIGS. 4, 5, and 6 show examples of the microstrip line electrode 350 when the resonator 310 is a disk or a ring that includes a partial sphere with the equator. In FIG. 4, the electrode 350 is formed on the top surface of the resonator 310 and another electrode 410 is formed in contact with the bottom surface of the resonator 310. FIG. 5 shows a half-circuit microstrip line as the top electrode 350 on the rim of the top surface. FIG. 6 shows two pieces of circular microstrip lines 350A and 350B (solid lines) as the top electrode 350 and two pieces of circular microstrip lines 410A and 410B as bottom electrodes (dot liens with shades).

Alternatively, the electrical coupler 130 in the system 100 of FIG. 1 may be designed to apply the electrical signal 132 to the entire resonator 101. FIG. 7 shows that a microwave resonator 700 may be used to enclose the optical micro resonator 101 and to fill the entire resonator 101 with the electrical signal 132. An opening is formed in the microwave resonator 700 to receive the electrical signal 132 so that the electrical energy from the electrical signal 132 is stored in one or more microwave modes of the resonator 700.

Figure 8:
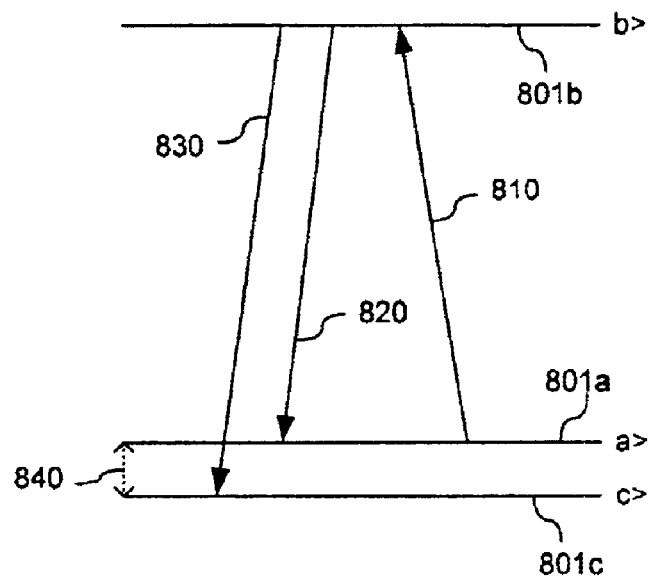
FIG. 8 shows one embodiment of the desired energy level structure in the dielectric material used for the resonator in FIG. 1, which has an excited state and two ground states.

Notably, the dielectric material for the micro resonator 101 is specially designed or selected to have an energy structure shown in FIG. 8 for interacting with both the input electrical signal 132 and the input optical signal 114. The energy structure has three energy levels 801a, 801b, and 801c where 801a and 801c are two different ground states and the level 801b is an exited state. Optical transitions are permissible from both ground states 801a and 801c to the excited state 801b. For example, upon absorbing photon from the input optical signal 114 in resonance with the transition 810 from the ground state 801a to the excited state 801b, an electron is excited from the ground state 801a to the excited state 801b. This electron on the excited state 801b, in turn, can emit an photon and thus decay to either of the ground states 801a and 801c, generally with different decay rates. Arrowed lines 820 and 830 represent such radiative decay processes. The two ground states have an energy difference 840 that corresponds to a frequency in the electrical domain, e.g., the RF, microwave, and millimeter spectral ranges. In addition, the relaxation or decay rate from the upper ground state 801a to the lower ground state 801c is small and is practically negligible in comparison with the decay rates from the excited state 801b to either ground state.

The above energy structure provides an optical pumping scheme to allow for direct conversion of the electrical signal 132 in resonance with the energy gap 840 to the optical signal 114 with a frequency in resonance with either of the optical transitions from the ground states 810a and 801c to the excited state 801b. Assume, for example, no electrical signal is applied to cause relaxation or redistribution of the electron population between the two grounds states 801a and 801c and there is an initial electron population in the ground state 801a. Also assume the optical signal 114 is in resonance with the transition 810 so that electrons on the ground state 801a absorb light in the optical signal 114 to jump to the excited state 801b while the electrons on the other ground state 801c do not absorb light and remain there. Once on the excited state 801b, a portion of the electrons emit photons at a wavelength in resonance with the transition 830 and decay to the other ground state 801c which is not optically excited. The remaining excited electrons decay back to the original ground state 801a and absorb light again. The net result of the above cycle is that, a portion of the electrons originally in the ground state 801a are transferred to the other ground state 801c. In absence of optical excitation, these electrons will remain at the ground state 801c. That is, the electron population available for optical absorption for the optical transition 810 is depleted. After a few cycles, no electrons will be left on the ground state 801a for the optical transition 810 and all electrons are transferred to and "trapped" in the other ground state 801c. As a result, the dielectric material of the resonator 101 essentially becomes completely transparent to the optical signal 132.

One consequence of this complete transparency state of the dielectric material is the optical loss is at the minimum. Therefore, the quality factor Q of the resonator 101 reaches its maximum if the optical signal 114 is coupled into the resonator 101 by the evanescent coupler 110 in a mode matched condition. This maximum Q can be high because whispering gallery mode micro resonators are known for high Q values. In general, the quality factor Q is limited by the attenuation of radiation in the dielectric material and the surface imhomogeneities. Some microspheres have been shown to have very high quality factors for light waves, exceeding $10^9$ for quartz microspheres. See, e.g., Braginsky V. B., Gorodetsky M. L., Ilchenko V. S, Phys.Lett., Vol. 137, p. 393 (1989) and Collot et al., Europhys. Lett., Vol. 23, p. 327 (1993). Such high Q values may allow concentration of strong fields in the whispering gallery modes. In quartz spheres of diameter on the order of 100 microns, whispering gallery modes may propagate very close to the surface of the resonator, typically in a thickness less than 10 microns. High Q values can also be achieved for waves in the mm and microwave regions of the electromagnetic spectrum.

The use of the dielectric material with the energy structure of FIG. 8 also suggests that, the quality factor Q of the resonator 101 is a sensitive function of the optical absorption. As the optical absorption changes, the optical energy confined in the resonator and hence optical output 116 change accordingly. This can be used to directly convert the modulation in the electrical signal 132 in resonance with energy gap 840 between the ground states 810a and 801c into modulation in the output optical signal 116. The following explains the basic operation of this scheme.

As described above, in absence of the electrical signal 132, the optical transition 810 between the ground state 801a and the excited state 801b transfers all electron population initially in the ground state 801a to the other ground state 801c which no longer interact with the optical signal 114. If the electrical signal 132 at a frequency in resonance with the energy gap is applied 840, the energy in the electrical signal 132 is absorbed by the electrons trapped in the ground state 801c to jump to the depleted ground state 801a. This process in effect makes the electrons available again for absorbing energy in the optical signal 114 in the transition 810 to artificially overcome the lack of sufficient relaxation between the ground states 801a and 801c. In addition, the quality factor Q of the resonator 101 is significantly reduced due to the increase of the optical loss upon application of the signal 132 in resonance with the gap 840. Therefore, in the presence of such a signal 132, the dielectric material becomes at least partially opaque to the optical signal 114. The degree of this opaqueness of the dielectric material depends on the characteristics of the signal 132, such as the deviation of the frequency of the signal 132 from the resonance frequency of the energy gap 840, the amplitude of the signal 132, or both the frequency deviation and the amplitude. This dependence can be used to directly convert a modulation in the electrical signal 132 to the optical signal in the resonator 101 or the output optical signal 116.

For example, the frequency of the electrical signal 132 may be modulated to be on and off the resonance condition to turn on or off the repopulation between the ground states 801a and 801c to modulate light in the whispering gallery mode. Also, the intensity or power of the electrical signal 132 may be modulated to change the strength of the repopulation to modulate the light.

Figure 9:
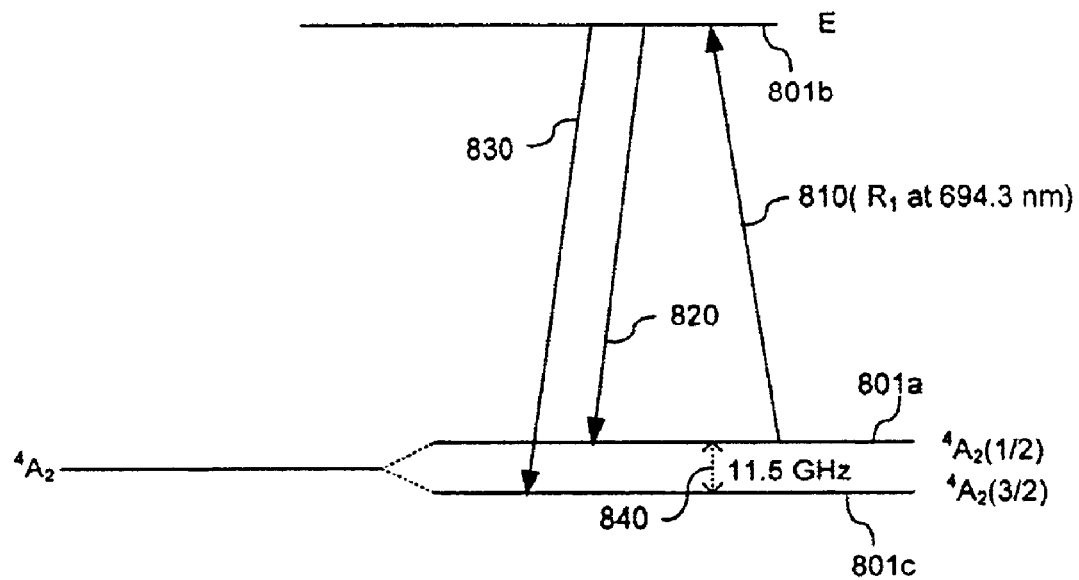
FIG. 9 shows the relevant energy levels in Chromium-doped ruby as one exemplary implementation of the dielectric material with the energy structure shown in FIG. 8.

The dielectric material with the energy structure in FIG. 8 may be implemented by using a range of materials. Certain crystals or glass materials may be doped. Chromium-doped ruby, for example, may be used. FIG. 9 shows the relevant energy states of Chromium ions in ruby where the hyperfine splitting of the ground state $^4A_2$ produces two ground states $^4A_2$ (1/2) and $^4A_2$ (3/2) that are separated by about 11.5 GHz. The transition from the ground state $^4A_2$ to the excited state E is the "$R_1$" transition at a wavelength of about 694.3 nm. A micro sphere resonator formed of such doped ruby with a diameter of 2.5 mm is estimated to produce an intrinsic quality factor of about $10^8$. The estimated Q may be about 10,000 at the room temperature.

In practice, a microwave field or signal at 11.5 GHz may be coupled to fill the entire resonator. This can be advantageous because the optical field in the whispering gallery mode, confined to a small mode volume of less than about 30-micron radial extent near the equator surface, partially overlaps with the microwave field. This partial overlap allows for the use of ruby with normal concentrations of chromium ions to reduce the effect of relaxation between the hyperfine ground states. The rate of this relaxation is ordinarily high so that absorption may be observed at a temperature of about 77 K or below. The $Cr^{3+}$ concentration should be small so that the relaxation process does not mask the absorption of the applied microwave field. The signal generated through relaxation (i.e., noise) should be smaller than the applied microwave power (signal). At the room temperature, the relaxation rate between the two ground states $^4A_2(1/2)$ and $^4A_2(3/2)$ is about $10^7$ per second. Hence, for a ruby sphere of 2.5 mm and doped with chromium at $1.2 \times 10^{18}$ per cubic centimeter, the microwave power for this relaxation rate is about 0.1 microwatts. This noise is about a factor of 10 less than the goal of detecting a signal of one microwatt. Thus, the partial and incomplete overlap between the optical mode and a portion of the microwave field volume in fact can facilitate the detectability of this signal level above the noise. The above estimate is approximate in that the loss in coupling the microwave power to the resonator is not included.

Chromium is just one example of various suitable dopants for the dielectric material for the resonator 101. Notably, other transition elements, such as the magnetic ions like manganese or iron, may also be used to dope ruby or other dielectric materials. Different ions generally have different hyperfine splitting of the ground state so that different electrical frequency ranges may be achieved. For a given dopant ion, the Zeeman splitting of the ground-state hyperfine lines may be controlled by applying and controlling an external magnetic field. As the magnitude of the applied external magnetic field is adjusted, the operating frequency range of the electrical signal 132 can be adjusted accordingly to match the changed energy gap 840. In addition, the Zeeman splitting may be controlled internally by using proper dopants that affect the net magnetic field at the sites of the active ions. The two techniques for controlling the Zeeman splitting of the active ions may also be combined. The use of the external magnetic field can provide a tuning capability to the system 100 by adjusting the magnetic field.

Hence, the present scheme works based on the direct absorption of the electrical signal 132 by the electrons in the dielectric material. This process directly changes the electron population available for Participating the optical transition in resonance with the input optical signal 114 coupled into the whispering gallery mode of the resonator 101. In this context, the electrical to optical conversion is direct and can be highly efficient to achieve single microwave photon detection of an electrical signal or sensitive and efficient electrical-to-optical conversion.

Figure 10:
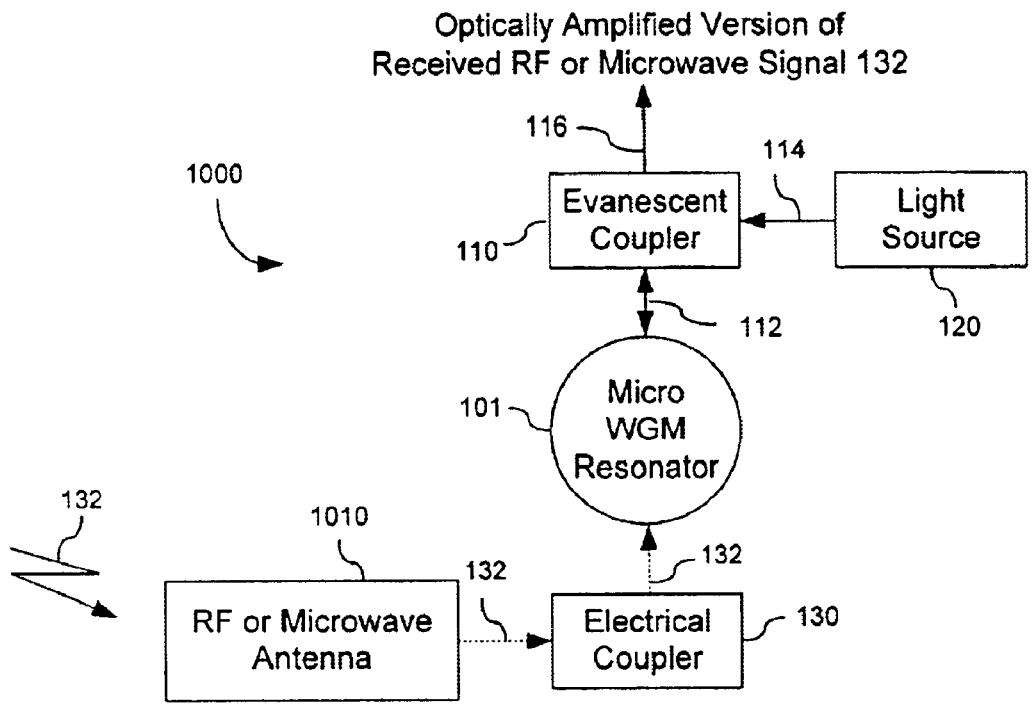

The system 100 in FIG. 1 may be used as a highly sensitive wireless RF or microwave receiver or transceiver as shown in the device 1000 in FIG. 10. An antenna (1010) may be used to receive the signal 132 and supply the received signal 132 to the electrical coupler 130. When a received signal 132 matches the energy gap 840 of the ground states 801a and 801c, the information in the signal 132 is converted into the optical domain in the optical output 116. The high Q factor of the resonator 101 effectuates an amplification of the modulation in the received electrical signal upon conversion into the optical modulation. The higher the Q, the greater this amplification. Therefore, the system 100 may be used for receiving signals in a wireless network of RF transceivers such as in a base station or a moving transceiver in a wireless communication network or in a satellite communication system. This system 100 can also detect electromagnetic radiation emitted from a medium or sample under measurement. The measured modulation can be extracted to determine certain properties, such as the molecular or atomic structure of the sample.

Figure 11:
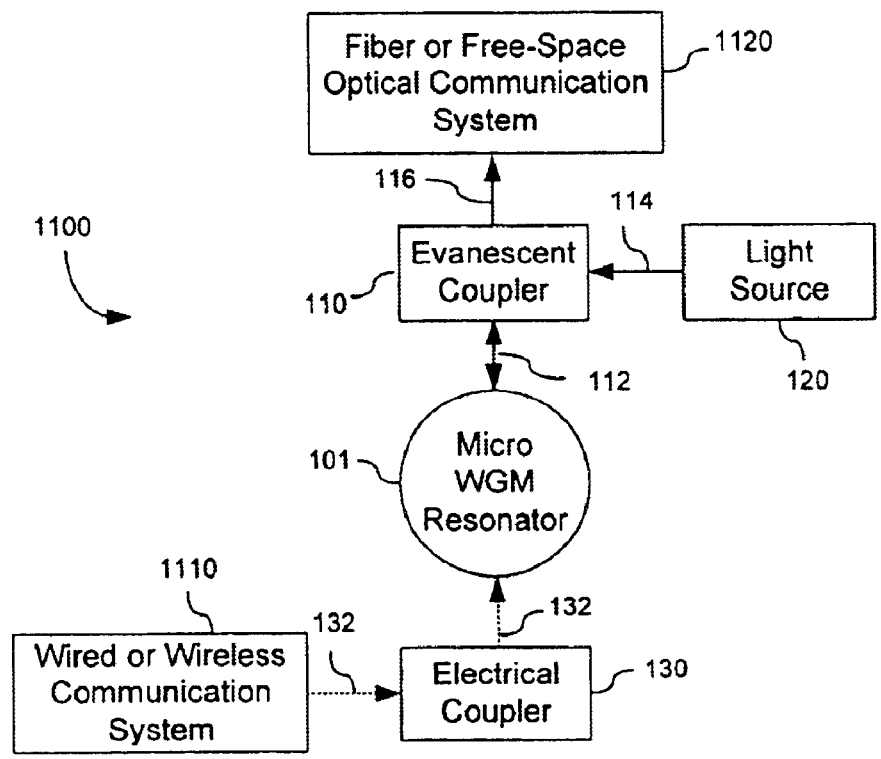

In addition, the system 100 may be used as a highly efficient and low power optical modulator for a range of applications, including optical transmitter or transceiver in an optical communication systems or as an communication interface between an electronic wireless or wired communication system (1110) and an optical free-space or fiber communication system (1120) as shown in an exemplary system 1100 in FIG. 11.

It is further contemplated that, the above direct electrical-to-optical conversion mechanism may be combined with electro-optic modulation techniques. In addition to the energy structure shown in FIG. 8, the dielectric material of the resonator 101 may also be designed to exhibit the electro-optic effect so that its refractive index changes with an applied electrical field. U.S. Pat. No. 6,473,218 issued on Oct. 29, 2002 from U.S. application Ser. No. 09/591,866 filed on Jun. 12, 2000 by Maleki et al., for example, describes electro-optic modulators based on micro whispering gallery mode resonators. This combination can be used to form novel modulators.

Only a few embodiments are disclosed. However, it is understood that variations and enhancements may be made without departing from the spirit of and are intended to be encompassed by the following claims.

What is claimed is:

1. A device, comprising:
    an optical resonator designed to support whispering gallery modes and formed of a dielectric material that has an energy level structure that absorbs light at a selected optical frequency and absorbs electrical energy at an electrical frequency, wherein absorption of said electrical energy changes absorption of said light;

an optical coupler positioned adjacent to said optical resonator to evanescently couple optical energy into said optical resonator in a whispering gallery mode or out of said optical resonator; and an electrical coupler positioned to couple an electrical signal at said electrical frequency into said optical resonator to at least partially overlap with said whispering gallery mode to modulate optical energy in said optical resonator by modulating said absorption.

2. The device as in claim 1, wherein said energy structure includes first, second, and third different energy levels to allow for (1) at least one optical transition between the first and said second energy levels at said selected optical frequency and (2) an electronic transition between said second and said third energy levels in resonance with said electrical frequency.

3. The device as in claim 2, wherein a relaxation between said second and said third energy levels is substantially less than a rate of optical absorption in said one optical transition.

4. The device as in claim 2, wherein said first energy level is an excited state and said second and said third energy levels are ground states.

5. The device as in claim 4, wherein said second and said third energy levels are two different hyperfine energy splitting levels of a common energy level.

6. The device as in claim 5, further comprising a tuning mechanism to adjust an energy difference between said second and said third energy levels.

7. The device as in claim 6, wherein said tuning mechanism includes a mechanism operable to produce a tunable magnetic field at said optical resonator.

8. The device as in claim 1, wherein said dielectric material is doped with transition ions.

9. The device as in claim 8, wherein said transition ions include chromium.

10. The device as in claim 8, wherein said transition ions includes iron.

11. The device as in claim 8, wherein said transition ions include manganese.

12. The device as in claim 8, wherein said dielectric material includes a crystal.

13. The device as in claim 8, wherein said dielectric material includes a glass.

14. The device as in claim 8, wherein said dielectric material is further doped with ions that affect a net magnetic field at each transition ion.

15. The device as in claim 1, wherein said dielectric material includes a ruby doped with transition ions.

16. The device as in claim 15, wherein said transition ions include chromium.

17. The device as in claim 1, wherein said dielectric material exhibits an electro-optic effect to change a refractive index in response to an electric field.

18. The device as in claim 1, wherein said optical resonator include a spherical portion of a sphere.

19. The device as in claim 18, wherein said spherical portion includes an equator of said sphere.

20. The device as in claim 18, wherein said optical resonator has a disk shape.

21. The device as in claim 18, wherein said optical resonator has a ring shape.

22. The device as in claim 1, wherein said optical resonator is a sphere.

23. The device as in claim 1, wherein said optical resonator has a non-spherical shape.

24. The device as in claim 1, wherein said optical coupler includes a prism.

25. The device as in claim 1, wherein said optical coupler includes an angle-polished waveguide.

26. The device as in claim 25, wherein said waveguide is a fiber.

27. The device as in claim 25, wherein said waveguide is a planar waveguide formed on a substrate.

28. The device as in claim 1, wherein said optical coupler includes an input coupler and an output coupler.

29. The device as in claim 1, wherein said optical coupler is operable to produce an optical output from said optical resonator.

30. The device as in claim 29, further comprising an optical detector coupled to convert said optical output into an electronic signal.

31. The device as in claim 29, further comprising an optical device coupled to receive said optical output.

32. The device as in claim 29, wherein said optical device includes a fiber.

33. The device as in claim 1, wherein said electrical coupler includes an electrical wave cavity that at least partially encloses said optical resonator.

34. The device as in claim 1, wherein said electrical coupler includes electrodes.

35. The device as in claim 1, further comprising a signal generator operable to generate said electrical signal.

36. The device as in claim 1, further comprising an antenna coupled to said electrical coupler and operable to convert an electromagnetic wave into said electrical signal received by said electrical coupler.

37. The device as in claim 1, further comprising a light source operable to produce said light.

38. A wireless communication system, comprising a plurality of wireless transceivers, at least one transceiver including:

an antenna to receive an electromagnetic wave signal at an electrical frequency;

a light source to produce light at a selected optical frequency;

an optical resonator designed to support whispering gallery modes and formed of a dielectric material that has an energy level structure that absorbs light at said selected optical frequency and absorbs electrical energy at said electrical frequency, wherein absorption of said electrical energy changes absorption of said light;

an optical coupler positioned adjacent to said optical resonator to evanescently couple optical energy into said optical resonator in a whispering gallery mode or out of said optical resonator; and an electrical coupler coupled to receive said electromagnetic wave signal from said antenna and positioned to couple said electromagnetic wave signal into said optical resonator to at least partially overlap with said whispering gallery mode to modulate optical energy in said optical resonator by modulating said absorption.

39. The system as in claim 38, further comprising a satellite on which said one transceiver is located.

40. The system as in claim 38, wherein said one transceiver is a base station.

41. The system as in claim 38, wherein said one transceiver is a moving unit.

42. A communication system, comprising:

an electronic communication system operable to transfer information on electrical signals;

an optical communication system operable to transfer information on optical signals; and an interface between said electronic communication system and said optical communication system, said interface comprising:

a light source to produce light at a selected optical frequency, an optical resonator designed to support whispering gallery modes and formed of a dielectric material that has an energy level structure that absorbs light at said selected optical frequency and absorbs electrical energy at an electrical frequency supported by said electronic communication system, wherein absorption of said electrical energy changes absorption of said light, an optical coupler positioned adjacent to said optical resonator to evanescently couple optical energy into said optical resonator in a whispering gallery mode or out of said optical resonator, and an electrical coupler coupled to receive an electrical signal from said electronic communication system and positioned to couple said electrical signal into said optical resonator to at least partially overlap with said whispering gallery mode to modulate optical energy in said optical resonator by modulating said absorption, wherein said optical coupler further couples modulated optical energy out of said optical resonator into said optical communication system.

43. The system as in claim 42, wherein said optical communication system includes a free space system.

44. The system as in claim 42, wherein said optical communication system includes a fiber system.

45. The system as in claim 42, wherein said electronic communication system includes a wireless system.

46. The system as in claim 42, wherein said electronic communication system includes a wired system.

47. A system, comprising a device which comprises:

an optical resonator designed to support whispering gallery modes and formed of a dielectric material that has an energy level structure which comprises first, second, and third different energy levels to allow for (1) at least one optical transition between the first and said second energy levels at a selected optical frequency, (2) an electronic transition between said second and said third energy levels in resonance with a different frequency, and (3) absorption at said electronic transition changes absorption at said optical transition;

an optical coupler positioned adjacent to said optical resonator to evanescently couple light in resonance with said optical transition into said optical resonator in a whispering gallery mode or out of said optical resonator; and an electrical coupler positioned to couple an electrical signal in resonance with said electronic transition into said optical resonator to at least partially overlap with said whispering gallery mode to modulate optical energy in said optical resonator by modulating absorption of said electrical signal at said electronic transition.

48. The system as in claim 47, further comprising an antenna to receive a radiation wave that comprises said electrical signal in resonance with said electronic transition and connected to said electrical coupler to couple said electrical signal to said electrical coupler.

49. The system as in claim 47, wherein a relaxation between said second and said third energy levels is substantially less than a rate of optical absorption in said one optical transition.

50. The system as in claim 47, wherein said first energy level is an excited state and said second and said third energy levels are ground states.

51. The system as in claim 50, wherein said second and said third energy levels are two different hyperfine energy splitting levels of a common energy level.

52. The system as in claim 51, further comprising a tuning mechanism to adjust an energy difference between said second and said third energy levels.

53. The system as in claim 52, wherein said tuning mechanism comprises a mechanism operable to produce a tunable magnetic field at said optical resonator.

54. The system as in claim 47, wherein said dielectric material exhibits an electro-optic effect to change a refractive index in response to an electric field.

* * * * *